United States Patent

[11] 3,615,930

[72] Inventors Wilhelmus Franciscus Knippenber Emmasingel, Eindhoven, Netherlands; Arthur William Moore, Parma, Ohio

[21] Appl. No. 677,897
[22] Filed Oct. 25, 1967
[45] Patented Oct. 26, 1971
[73] Assignee U. S. Philips Corporation New York, N.Y.
[32] Priority Oct. 25, 1966
[33] Netherlands
[31] 6,615,060

[54] METHOD OF MANUFACTURING SILICON CARBIDE CRYSTALS
2 Claims, 5 Drawing Figs.

[52] U.S. Cl. .......... 148/175, 23/204, 23/208, 23/294, 23/301, 117/106, 117/107.2, 148/1.5, 148/1.6, 148/174, 252/62.3, 317/237
[51] Int. Cl. .......... H01l 7/00, C01b 31/36, R01j 17/28
[50] Field of Search .......... 148/1.5, 174, 175, 1.6; 117/106, 107.2, 200; 252/62.3; 23/204, 208, 294, 301; 317/237

[56] References Cited

UNITED STATES PATENTS

| | | | |
|---|---|---|---|
| 3,065,116 | 11/1962 | Marinace | 148/1.5 |
| 3,129,125 | 4/1964 | Hamilton | 148/174 |
| 3,228,756 | 1/1966 | Hergenrother | 23/301 |
| 3,236,780 | 2/1966 | Ozarow | 252/62.3 X |
| 3,275,415 | 9/1966 | Chang et al. | 23/208 |
| 3,377,210 | 4/1968 | Somerville et al. | 148/1.5 |
| 3,396,059 | 8/1968 | Giammanco | 148/171 |
| 3,458,779 | 7/1969 | Blank et al. | 317/237 X |

FOREIGN PATENTS

| | | | |
|---|---|---|---|
| 732,784 | 4/1966 | Canada | 252/62.3 |
| 1,031,783 | 6/1966 | Great Britain | 148/1.5 |

OTHER REFERENCES

Brander, R. W. " Epitaxial Growth of Silicon Carbide," J. Electrochemical Society, Vol. III, No. 7, July 1964, p. 881– 883.

Dumin, D. J., " Electrical Properties of Silicon Films Grown Epitaxially on Sapphire," J. Applied Physics 38, 1909– 1914 (1967)

Chang, Hung-Chi, et al., " Use of Silicon Carbide in High-Temperature Transistors," Proceedings of the conference on Silicon Carbide, Boston, Mass., Apr. 1959, Pergamon Press, pp. 496– 507

*Primary Examiner*—L. Dewayne Rutledge
*Assistant Examiner*—W. G. Saba
*Attorney*—Frank R. Trifari

ABSTRACT: A method of manufacturing silicon carbide crystals with a narrow PN junction in which during growth of such crystals by recrystallization and/or condensation in an inert gas atmosphere in a space bounded by silicon carbide, dopants which can result in different conductivities are successively supplied to the crystallization space. N-type crystals are formed at temperatures between 2,300° and 2,600° C. in presence of a donor. Then the temperature is decreased to 2,000° C. and the space freed of the donor. Aluminum is then supplied to the space and the temperature raised to 200° to 300° C. lower than that at which the first part of the crystals were formed.

Figure 1:
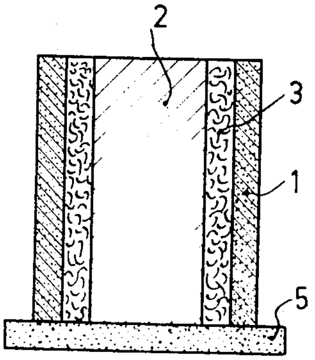

INVENTORS
WILHELMUS F. KNIPPENBERG
ARTHUR W. MOORE
BY

AGENT

METHOD OF MANUFACTURING SILICON CARBIDE CRYSTALS

This invention relates to the manufacture of silicon carbide crystals for semiconductor devices.

It is known that silicon carbide crystals having a PN junction may be manufactured in that during the growth of the crystal by recrystallization and/or condensation in an atmosphere of inert gas on the wall of a space bounded by silicon carbide at temperatures of approximately 2,500° C., dopants which can cause different conduction properties of the silicon carbide are successively supplied to the gas atmosphere.

However, due to diffusion of the dopants into the crystals at the very high temperatures, a well-defined junction between the P-type and N-type regions is not obtained.

Tests which have led to the present invention revealed that among the conventional dopants for silicon carbide, the aluminum which is active as an acceptor considerably enhances the growth of silicon carbide crystals by recrystallization and/or condensation. It is thus possible for the growth of the P-conductive part of the crystal to be carried out at a temperature which is from 200° to 300° C. lower than that which was required in forming the N-conductive part, resulting in a greatly reduced diffusion in the boundary region between the said parts. It is thus possible to obtain a crystal having a considerably sharper junction between the P-region and the N-region, which is highly beneficial to the quality of semiconductor devices, such as diodes and transistors, formed in the usual manner with such crystals.

The invention relates to a method of manufacturing silicon carbide crystals in which a PN junction is obtained in that during the growth of the crystals by recrystallization and/or condensation in an inert gas atmosphere in a space bounded by silicon carbide, dopants which can bring about different conduction properties in silicon carbide are successively supplied to the crystallization space, and it is characterized in that N-type silicon carbide crystals are formed at temperatures between 2,300° and 2,600° C. in the presence of a donor, the temperature is decreased below 2,000° C., then after the crystallization space has been completely freed of donor, aluminum is supplied thereto as an acceptor and the growth of the silicon carbide crystals is continued at a temperature which is from 200° to 300° C. lower than that at which the first part of the crystals has been formed.

The invention will now be described in detail with reference to the drawing and several examples.

EXAMPLE 1

As shown in section in FIG. 1, a core 2 is placed in a graphite tube 1 and the interspace filled with silicon carbide 3, which is obtained by pyrolysis of methyl chlorosilane $SiHCl_2CH_3$ in hydrogen.

The silicon carbide powder is compressed and the core 2 carefully removed, whereupon the whole is sintered.

Figure 2:
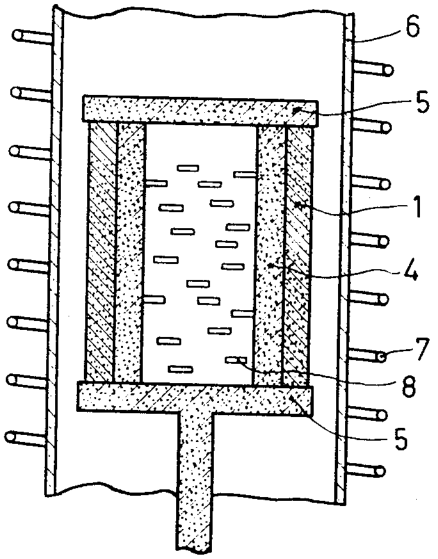

The resulting vessel comprising the graphite cylinder 1 and the cylinder 4 of sintered silicon carbide is closed at each end by a plate 5, as shown in FIG. 2. Subsequently it is heated to 2,550° C. in a quartz envelope 6 in argon containing 0.1 percent of nitrogen at atmospheric pressure by means of a high-frequency coil 7, resulting in plate-shaped N-type silicon carbide crystals 8 being formed by recrystallization and/or condensation approximately at right angles to the wall of the vessel.

Figure 3:
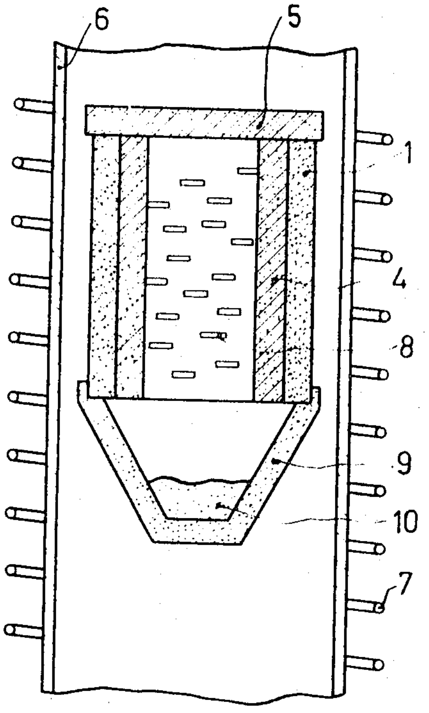

After cooling, as shown in FIG. 3, the vessel 1–4 is placed on a graphite vessel 9 filled with aluminum carbide 10, whereafter the whole is closed by a plate 5. Upon heating the crystals 8 to 2,250° C. and the aluminum carbide 10 to 2,100° C. in an argon atmosphere, P-conductive silicon carbide containing aluminum as an acceptor is epitaxially deposited on the crystals.

Figure 4:
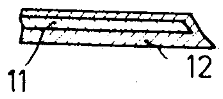

FIG. 4 is a diagrammatic sectional view of such a crystal. THe N-conductive part 11 of the crystal contains approximately 0.001 percent of nitrogen and the P-conductive part 12 approximately 0.1 percent of aluminum.

Figure 5:
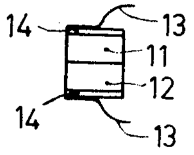

This crystal is sawn into plates each of 1 sq. mm. and 0.5 mm. thick, which, as shown on an enlarged scale in FIG. 5, are provided with platinum contact wires on the N-type part 11 and the P-type part 12 by applying by fusion a gold alloy 14 containing 5 percent of tantalum at 1,300° C.

The resulting diode when loaded by 10 volts 1, plate-shaped milliamperes radiates orange light. For higher injection currents, such as 300 milliamperes, blue light is emitted.

EXAMPLE 2

In a similar manner as has been described in example 1, plate-shaped N-conductive silicon carbide crystals 8 are formed on which silicon carbide is epitaxially deposited which is P-conductive by supplying aluminum and boron via the gas phase. To this end, the vessel 9 is filled with a mixture of aluminum carbide and boron carbide. The P-conductive silicon carbide is deposited at the same temperatures as specified in example 1.

Due to the presence of the aluminum the deposition in this case also could be carried out at a temperature lower than that which was necessary in forming the N-conductive substrate crystals, while due to the fact that boron diffuses into silicon carbide more rapidly than aluminum, the boron being absorbed is a measure of the PN junction and hence of the color of the light which is radiated by a diode manufactured as shown in FIG. 5. For an injection current of 30 milliamperes at 10 volts, green light is emitted. For higher injection currents, such as 300 milliamperes, the emitted light has a blue color as with the diode described in example 1.

What is claimed is:

1. A method of manufacturing a silicon carbide crystal containing a narrow PN junction comprising providing a furnace containing a space bounded by silicon carbide, heating the silicon carbide bounded space at a first temperature between 2,300° and 2,600° C. in an inert gas atmosphere containing a donor to grow by recrystallization and condensation a first crystal portion of donor-doped, N-type silicon carbide, reducing the space temperature below 2,000° C. and completely freeing the space of the donor, thereafter reheating the silicon carbide bounded space containing the first crystal portion in an inert gas atmosphere containing aluminum as an acceptor and crystal growth enhancement agent but at a second temperature from 200° to 300° C. below the first temperature to grow epitaxially by recrystallization and condensation on the first crystal portion a second crystal portion of aluminum-doped, P-type silicon carbide forming a narrow PN junction with the first crystal portion.

2. A method as set forth in claim 1 wherein the first temperature is approximately 2,550° C., and the second temperature is approximately 2,250° C.

* * * * *